United States Patent
Fukuda et al.

(10) Patent No.: US 9,068,114 B2
(45) Date of Patent: Jun. 30, 2015

(54) METAL FLUORIDE EUTECTIC, NEUTRON SCINTILLATOR AND NEUTRON IMAGING DEVICE

(75) Inventors: Kentaro Fukuda, Shunan (JP); Noriaki Kawaguchi, Shunan (JP); Akira Yoshikawa, Sendai (JP); Takayuki Yanagida, Sendai (JP); Yui Yokota, Sendai (JP); Yutaka Fujimoto, Sendai (JP)

(73) Assignees: TOKUYAMA CORPORATION, Shunan-Shi (JP); TOHOKU UNIVERSITY, Sendai-Shi (JP)

(*) Notice: Subject to any disclaimer, the term of this patent is extended or adjusted under 35 U.S.C. 154(b) by 71 days.

(21) Appl. No.: 13/822,744

(22) PCT Filed: Nov. 1, 2011

(86) PCT No.: PCT/JP2011/075227
§ 371 (c)(1),
(2), (4) Date: Mar. 13, 2013

(87) PCT Pub. No.: WO2012/060395
PCT Pub. Date: May 10, 2012

(65) Prior Publication Data
US 2013/0168561 A1 Jul. 4, 2013

(30) Foreign Application Priority Data
Nov. 2, 2010 (JP) ................. 2010-246608

(51) Int. Cl.
| | |
|---|---|
| C09K 11/61 | (2006.01) |
| C09K 11/77 | (2006.01) |
| G01T 3/06 | (2006.01) |
| G21K 4/00 | (2006.01) |
| C30B 21/00 | (2006.01) |
| C30B 29/12 | (2006.01) |

(52) U.S. Cl.
CPC ............ *C09K 11/616* (2013.01); *C09K 11/772* (2013.01); *G01T 3/06* (2013.01); *G21K 4/00* (2013.01); *G21K 2004/06* (2013.01); *C30B 21/00* (2013.01); *C30B 29/12* (2013.01)

(58) Field of Classification Search
CPC ..... C30B 29/12; C30B 21/00; G21K 2004/06
See application file for complete search history.

(56) References Cited

U.S. PATENT DOCUMENTS

| 6,649,326 B2 | 11/2003 | Allan et al. |
| 6,806,039 B2 | 10/2004 | Allan et al. |

FOREIGN PATENT DOCUMENTS

| EP | 1754808 A1 | 2/2007 |
| EP | 2219048 A2 | 8/2010 |

(Continued)

OTHER PUBLICATIONS

N. Kawaguchi, K. Fukuda, T. Yanagida, Y. Fujimoto, Y. Yokuta, K. Watanabe, A. Yamazaki, T. Suyama, and A. Yoshikawa, "Neutron Response of Rare-Earth-Doped 6LiF/CaF2 Eutectic Composites with the Ordered Lamellar Structure." Nuclear Science Symposium and Medical Imaging Conference Record, 2010 IEEE, Knoxville, Tenn., Oct. 30, 2010 to Nov. 6, 2010, pp. 1000-1003, <doi:10.1109/NSSMIC.2010.5873914>.*

(Continued)

*Primary Examiner* — Constantine Hannaher
(74) *Attorney, Agent, or Firm* — Birch, Stewart, Kolasch & Birch, LLP (57) ABSTRACT

[Problems to be Solved] A neutron scintillator excellent in detection efficiency for neutrons, an S/N ratio, and n/γ discrimination ability, and a eutectic preferred for the neutron scintillator are provided.
[Means to Solve the Problems] A metal fluoride eutectic, in which a lithium fluoride crystal phase and a crystal phase represented by the chemical formula $Ca_{1-x}Sr_xF_2$ (where x denotes a number greater than 0, but not larger than 1), such as $SrF_2$ or $Ca_{0.5}Sr_{0.5}F_2$, are present in a phase-separated state; a neutron scintillator comprising the eutectic; and a neutron imaging device comprising a combination of the neutron scintillator and a position-sensitive photomultiplier tube.

6 Claims, 4 Drawing Sheets

(56) References Cited

FOREIGN PATENT DOCUMENTS

| EP | 2256177 A1 | 12/2010 |
|---|---|---|
| JP | 54-139895 A | 10/1979 |
| JP | 2005-503313 A | 2/2005 |
| JP | 2007-45870 A | 2/2007 |
| SU | 992606 A1 | 1/1983 |
| WO | WO 2004/072680 A2 | 8/2004 |
| WO | WO 2009/119378 A1 | 10/2009 |

OTHER PUBLICATIONS

International Search Report Issued in PCT/JP2011/075227, mailed on Dec. 20, 2011.

Kawaguchi et al., "Fabrication and Characterization of Large Size LiF/CaF2:Eu Eutectic Composites with the Ordered Lamellar Structure", 2010 Symposium on Radiation Measurements and Applications Abstract Book, May 24-28, 2010, p. 57.

Nagakubo et al., "Activity Coefficients of Component Ions in LiF-SrF2 and NaF-SrF2 Systems", Denki Kagaku, Oct. 5, 1995, vol. 63, No. 10, pp. 938-940.

Rhodes et al., "Pixelated Neutron Scintillation Detectors Using Fibre Optic Coded Arrays", Nuclear Instruments and Methods in Physics Research A 392, 1997, pp. 315-318.

Trojan-Piegza et al. "CaF2(EU2+):LiF—Structural and Spectroscopic Properties of a New System for Neutron Detection", Radiation Measurements, Jan. 11, 2010, pp. 1-5.

Extended European Search Report dated Feb. 5, 2014 for European Application No. 11838045.0.

* cited by examiner

→ SOLIDIFICATION DIRECTION

METAL FLUORIDE EUTECTIC, NEUTRON SCINTILLATOR AND NEUTRON IMAGING DEVICE

TECHNICAL FIELD

This invention relates to a novel metal fluoride eutectic, and a neutron scintillator comprising the eutectic. More specifically, the invention relates to a metal fluoride eutectic comprising a lithium fluoride crystal phase and a strontium fluoride-based crystal phase.

BACKGROUND ART

Neutron detectors are a component technology supporting neutron beam application technologies. With the progress of neutron application technologies in academic research fields such as neutron diffraction, in nondestructive inspection fields, or in security fields such as cargo inspection, neutron detectors with higher performance are desired.

Main performances demanded of the neutron detector are a detection efficiency for neutrons, the count rate of neutrons, and the ability to discriminate between neutrons and gamma rays (may hereinafter be referred to as n/γ discrimination ability). The detection efficiency means the ratio of the number of radiations counted by the detector to the number of radiations emitted from a radiation source and entered into the detector. The count rate means the number of radiations counted per unit time. γ rays are generated when neutrons hit an element—contained in a constituent member of a detection system for detecting neutrons, or in an object to be tested—such as Fe (iron), Pb (lead), Cd (cadmium), C (carbon) or N (nitrogen). If the ability to discriminate between neutron radiation and γ rays is low, a false signal due to gamma ray which does not reflect the interaction between neutrons and the object to be tested contaminate the true neutron signals, and a so-called background noise increases.

Neutrons have a high power to pass through a substance without doing any interaction in the substance. Therefore, a nuclear reaction for promptly converting neutrons into charged particles having energy is generally utilized to detect the neutron radiation. For example, a helium-3 ($^3$He) detector which detects neutrons by utilization of protons or tritons generated by a nuclear reaction between $^3$He and neutrons has so far been known. This detector has high detection efficiency and excellent n/γ discrimination ability, but has posed the problem of a limited count rate. Moreover, $^3$He is an expensive substance and its resources are limited.

Recently, the development of a detector using a neutron scintillator, instead of the above-mentioned $^3$He gas process, has been underway in an attempt to produce an inexpensive and upsized detector. The neutron scintillator refers to a substance which, when hit by neutrons, absorbs the neutrons to emit fluorescence. The aforementioned various performances of a neutron detector using this scintillator depend on a substance constituting the scintillator. If the scintillator is composed of a light element which minimally interacts with γ rays, for example, the aforementioned background noise due to γ rays is reduced. The light yield from the scintillator affects the ratio between a pulse signal attributed to luminescence produced upon detection of neutrons and a pulse signal associated with an electrical noise, namely, S/N ratio. The content of $^6$Li isotope or the like, which captures neutrons with high efficiency, influences the detection efficiency. The decay time of fluorescence influences the count rate.

LiF/ZnS has been used as a neutron scintillator having a relatively high neutron detection efficiency and excellent n/γ discrimination ability (see Non-Patent Document 1). Since the LiF/ZnS is opaque, however, an increase in the thickness of the scintillator has made it impossible to take out scintillation light efficiently. Thus, the LiF/ZnS has been limited in the improvement of neutron detection efficiency.

In view of such problems, a proposal has been made for a neutron scintillator comprising a eutectic composed of europium-containing calcium fluoride crystals and lithium fluoride crystals (see Non-Patent Document 2). This neutron scintillator composed of the eutectic is translucent, and enables scintillation light to be collected with high efficiency. Thus, this neutron scintillator can achieve a very high neutron detection efficiency. According to studies by the inventors of the present invention, however, the eutectic has been poor in n/γ discrimination ability, and still has left room for improvement. Furthermore, the eutectic containing calcium fluoride crystals has posed the problems that when used as a scintillator, it does not provide a sufficient light yield, and it is insufficient for discriminating between a pulse signal due to luminescence generated upon detection of neutrons and a pulse signal caused by an electrical noise.

PRIOR ART DOCUMENTS

Non-Patent Documents

Non-Patent Document 1: N. J. Rhodes, et al., "Pixelated neutron scintillation detectors using fibre optic coded arrays", Nuclear Instruments and Methods in Physics Research, A392, 315-318 (1997).

Non-Patent Document 2: J. Trojan-Piegza, et al., "CaF$_2$ (Eu$^{2+}$): LiF—Structural and spectroscopic properties of a new system for neutron detection", Radiation Measurements, 45, 163-167 (2010).

SUMMARY OF THE INVENTION

Problems to be Solved by the Invention

It is an object of the present invention to provide a neutron scintillator excellent in an S/N ratio for detection of neutrons, neutron detection efficiency and n/γ discrimination ability, and a crystal substance preferred for the neutron scintillator.

Means for Solving the Problems

The present inventors have conducted various studies on the chemical components of a crystal phase which constitutes a eutectic together with lithium fluoride crystals. As a result, they have found that a neutron scintillator having a good light yield is obtained by constructing a part of the eutectic from a crystal phase represented by the chemical formula $Ca_{1-x}Sr_xF_2$ (where x denotes a number greater than 0, but not larger than 1), and this neutron scintillator is improved in the S/N ratio in detecting neutrons. These findings have led them to accomplish the present invention.

That is, according to the present invention, there is provided a metal fluoride eutectic comprising a lithium fluoride crystal phase and a $Ca_{1-x}Sr_xF_2$ (where x denotes a number greater than 0, but not larger than 1) crystal phase.

In the above metal fluoride eutectic, it is preferred that 1) the $Ca_{1-x}Sr_xF_2$ (where x denotes a number greater than 0, but not larger than 1) crystal phase should contain at least one dopant selected from the group consisting of manganese, europium and cerium;

2) both crystal phases form a layered structure, and the layer thickness of the lithium fluoride crystal phase be 0.1 μm to 5 μm; and 3) the $Ca_{1-x}Sr_xF_2$ crystal phase be linearly continuous in one direction.

According to the present invention, there is also provided a neutron scintillator comprising the metal fluoride eutectic.

According to the present invention, there is further provided a neutron imaging device comprising a combination of the neutron scintillator and a position-sensitive photomultiplier tube.

Effects of the Invention

The present invention provides a neutron scintillator having a satisfactory S/N ratio in detecting neutrons, having a high detection efficiency for neutrons and excellent in n/γ discrimination ability, and a metal fluoride eutectic preferred for the neutron scintillator. A neutron detector using such a neutron scintillator can be preferably used in scientific research fields such as structural analyses by neutron diffraction, in nondestructive inspection fields, or in security fields such as cargo inspection.

MODE FOR CARRYING OUT THE INVENTION

The metal fluoride eutectic of the present invention is a eutectic comprising two crystal phases, i.e., a lithium fluoride (may hereinafter be referred to as LiF) crystal phase and a crystal phase represented by the chemical formula $Ca_{1-x}Sr_xF_2$ (where x denotes a number greater than 0, but not larger than 1) (may hereinafter be referred to as CaSrF).

In the $Ca_{1-x}Sr_xF_2$ crystal phase, x is a number larger than 0, but equal to or smaller than 1. Thus, this crystal phase refers to crystals containing at least strontium fluoride, and includes a case in which it is composed of $SrF_2$ crystals only and, in addition, a case where it is composed of crystals of any solid solution of calcium fluoride and strontium fluoride, for example, $Ca_{0.5}Sr_{0.5}F_2$ crystals. The composition ratio between calcium fluoride and strontium fluoride in the solid solution crystals can be controlled arbitrarily by changing the ratio of the amounts of the respective starting materials during production of the metal fluoride eutectic to be described later.

The metal fluoride eutectic can be used preferably as a neutron scintillator, because it emits scintillation light based on the following course upon entry of neutrons. First, when neutrons are incident on LiF, the neutrons are captured by $^6$Li-isotope in the LiF, whereby a capture reaction takes place to generate secondary particles, i.e., α particles and tritium. Then, such secondary particles migrate in the eutectic, reaching CaSrF and exciting the CaSrF. Finally, the excited CaSrF emits scintillation light. That is, the LiF and CaSrF of the eutectic of the present invention act, respectively, as a neutron capturing material and a fluorescent substance emitting scintillation light.

In the eutectic, the layer thickness of the laminar lithium fluoride crystal phase is preferably 0.1 to 5 μm. As described above, the secondary particles produced upon capture of neutrons in the LiF crystals migrate through the eutectic, and arrive at the CaSrF crystals. However, their energy is partly lost during the course of their migration. When the layer of the LiF crystal phase is thick, therefore, the energy imparted from the secondary particles generated by the nuclear reaction to the CaSrF crystal phase varies greatly, thus leading to great variations in the light yield emitted by the CaSrF crystal phase. Investigations by the present inventors have revealed that the smaller the layer thickness of the LiF crystal phase, the smaller variations the light yield shows, and that by setting the layer thickness at 5 μm or less, a neutron scintillator with excellent n/γ discrimination ability can be obtained. Setting the layer thickness of the LiF crystal phase at less than 0.1 μm is technically difficult, and requires a special measure. Thus, the lower limit of such a layer thickness should be 0.1 μm.

In the above metal fluoride eutectic, the component ratio between LiF and CaSrF (LiF/CaSrF) is not limited, but is preferably 0.75 mol/0.25 mol to 0.85 mol/0.15 mol, and is particularly preferably the component ratio of the composition at the eutectic point for LiF and CaSrF. The component ratio of the composition at the eutectic point for LiF and CaSrF is preferably the one experimentally determined beforehand, because it differs according to the composition ratio between the two components, calcium fluoride and strontium fluoride, constituting the CaSrF. If a molar ratio deviating greatly from such a component ratio at the eutectic point is adopted, there is a possibility that the resulting eutectic will be considerably cloudy, or that the light yield during use as a scintillator will decrease.

In the metal fluoride eutectic, it is preferred that the $^6$Li-isotope ratio of LiF be 20 to 99%. By setting the $^6$Li-isotope ratio at 20% or more, the probability for the capture reaction increases to raise the detection efficiency for neutrons. In order to raise the detection efficiency further, the $^6$Li-isotope ratio is set particularly preferably at 50% or more, and most preferably at 90% or more. In consideration of the cost involved in isotope enrichment, on the other hand, the $^6$Li-isotope ratio is preferably set at 99% or less.

The metal fluoride eutectic of the present invention is characterized most greatly by containing CaSrF which functions as the fluorescent substance emitting scintillation light. The light yield from CaSrF is larger than those from other publicly known metal fluoride eutectics, and makes it very easy to discriminate between a pulse signal by luminescence produced upon detection of neutrons and a pulse signal due to an electrical noise. Moreover, the light yield from CaSrF is sufficiently large in the case of excitation with secondary particles generated upon capture of neutrons, but is specifically small in the case of excitation with γ rays. According to the eutectic of the present invention, therefore, incidence of neutrons and incidence of γ rays can be easily discriminated based on the difference in the light yield, with the result that a neutron scintillator excellent in n/γ discrimination ability can be provided.

With the metal fluoride eutectic of the present invention, a dopant can be incorporated into the CaSrF crystals. This embodiment is preferred, because it increases the light yield when the eutectic is used as a scintillator. Such a content of the dopant can be adjusted by the amount of a dopant material added to a material mixture when the eutectic is to be produced. The dopant content in the crystals is not limited, but is preferably set at 0.05 to 10 mol % with respect to CaSrF. The dopant content of 0.05 mol % or more can increase the light yield when the eutectic is used as a scintillator. The dopant content of 10 mol % or less, on the other hand, can avoid problems, such as marked cloudiness of the eutectic or attenuation of scintillation light due to concentration quenching. With a high dopant content, a crystal phase of a fluoride of the dopant may form aside from doped CaSrF crystals. Basically, however, the crystal phase of the dopant fluoride does not present an obstacle, as long as the doped CaSrF crystals perform the scintillation function by the aforementioned mechanism.

Examples of the dopant are transition metals such as chromium (Cr), manganese (Mn), iron (Fe), cobalt (Co), nickel (Ni), copper (Cu) and zinc (Zn), and lanthanoids such as cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm) and ytterbium (Yb). In terms of the light yield, any of Mn, Eu and Ce is preferred. The exact existential state of atoms of the dopant is unknown. In the CaSrF crystals, however, most of these atoms may be present as substituting Sr atoms or Ca atoms, and some of them may be present within a crystal lattice as well.

Methods for producing the metal fluoride eutectic of the present invention are not limited. Generally, there can be employed a method which comprises mixing powders of basic raw materials such as lithium fluoride, calcium fluoride and strontium fluoride, and powders of a dopant material such as manganese fluoride, europium fluoride or cerium fluoride, to prepare a material mixture, heating the material mixture to melt it, and then cooling the resulting melt for solidification. In order to control a layered structure (thickness, continuity, linearity), in particular, the unidirectional solidification process for solidifying the melt in one particular direction can be used preferably.

Figure 1:
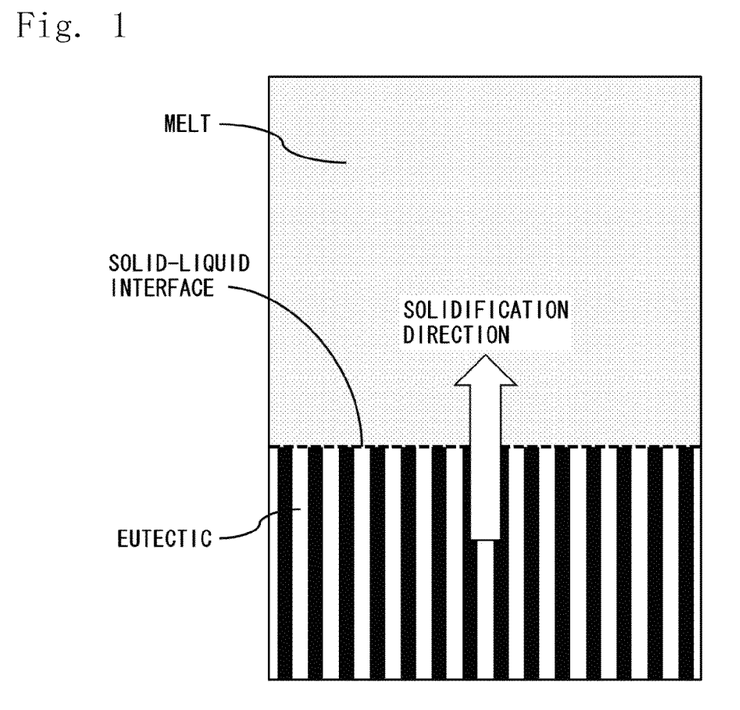
FIG. 1 is a schematic view of the unidirectional solidification process.

The unidirectional solidification process will be illustrated by FIG. 1 taken as an example. A melt is placed inside a furnace body adjusted to a high temperature in its upper portion and a low temperature in its lower portion. When either the melt is lowered, or the furnace body is raised, the melt is cooled from its lower part, and a part of the melt having a temperature below the solidification point solidifies to become a eutectic. At this time, a solid-liquid interface is formed between the eutectic and the melt. When the melt is further lowered, or the furnace body is further raised, the solid-liquid interface moves upward and the eutectic extends. By performing such a procedure continuously, the melt can be solidified in one specific direction. In the present invention, the direction in which the melt is solidified in the one specific direction is referred to as a solidification direction, and a rate at which solidification is allowed to proceed is referred to as a solidification rate.

According to the above-mentioned unidirectional solidification process, the layer thickness of the LiF crystal phase in the metal fluoride eutectic can be easily decreased by increasing the solidification rate, and a eutectic having a layer thickness of the LiF crystal phase of 5 μm or less can be produced efficiently. By means of the unidirectional solidification process, moreover, CaSrF crystals as well as LiF crystals extend along the solidification direction as shown in FIG. 1. As a result, a eutectic having the LiF crystal phase continuous linearly in one direction and also the CaSrF crystal phase continuous linearly in the one direction can be produced.

Figure 2:
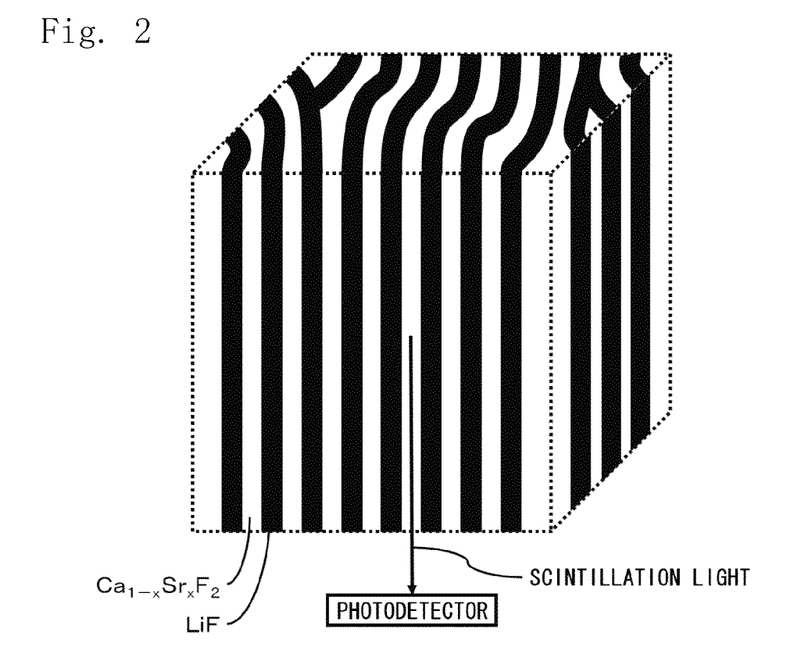
FIG. 2 is a schematic view showing the layered structure of a neutron scintillator according to the present invention.

The metal fluoride eutectic having the CaSrF crystal phase linearly continuous in one direction as above exhibits special effects when combined with a photodetector to construct a neutron detector. That is, in a eutectic composed of LiF crystals and CaSrF crystals, the CaSrF crystals generally fail to be linearly continuous in one direction. When scintillation light is emitted from CaSrF, therefore, the scintillation light is scattered at the interfaces between the CaSrF crystals and the LiF crystals. As a result, the propagation efficiency of scintillation light toward the photodetector decreases. In a neutron scintillator using a metal fluoride eutectic in which CaSrF crystals are linearly continuous in one direction, by contrast, the propagation efficiency of scintillation light is high in the direction of linear continuity of the CaSrF crystals (the direction indicated by an arrow in FIG. 2). Thus, a photodetector is placed at an end in the direction of the continuous crystals, whereby the detection efficiency for scintillation light in the photodetector can be increased.

The thickness of the CaSrF crystals is not limited, because it does not affect the propagation efficiency of scintillation light. However, the thickness is, for example, 0.1 to 10 μm.

Concrete methods illustrating the unidirectional solidification process are: the Bridgman method in which a crucible charged with a melt is placed within a furnace body adjusted to a high temperature in an upper portion thereof and a low temperature in a lower portion thereof, and the crucible is lowered to solidify the melt in one direction from bottom to top; the gradient freeze method in which a crucible charged with a melt is placed within a furnace body adjusted to a high temperature in an upper portion thereof and a low temperature in a lower portion thereof, and cooling is performed, with a temperature distribution being kept to hold the lower portion always at a low temperature, whereby the melt is solidified in one direction from bottom to top; the Czochralski method in which with a solid-liquid interface being held at a constant position, a eutectic is pulled up while being solidified in one direction; and the micro-pulling-down method in which with a solid-liquid interface being held at a constant position, a eutectic is pulled down while being solidified in one direction.

The production method adopting the unidirectional solidification process will be described in detail, with the Bridgman method taken as an example.

First, powders of lithium fluoride, calcium fluoride and strontium fluoride as starting materials are mixed to prepare a material mixture. If the aforementioned dopant is to be incorporated into CaSrF crystals, however, a fluoride of the dopant is added to the material mixture, or a material having the dopant incorporated beforehand in strontium fluoride and/or calcium fluoride is used as a starting material. If the CaSrF crystals are strontium fluoride crystals, calcium fluoride is not used.

The purity of the basic raw materials, i.e., lithium fluoride, calcium fluoride and strontium fluoride, or the purity of the dopant material such as manganese fluoride, europium fluoride or cerium fluoride is not limited, but is preferably 99.99% or higher. By using such high-purity materials and additives, the characteristics such as the light yield during use as a scintillator are improved. The respective materials used may be powdery or particulate materials, or may be used after being sintered or melt-solidified beforehand.

Then, the material mixture is charged into a crucible, and the charged crucible is set in a chamber equipped with a heater, a heat insulator, and a vacuum evacuator. Using the vacuum evacuator, the interior of the chamber is evacuated to $1.0\times10^{-3}$ Pa or lower. Then, an inert gas such as high purity argon is introduced into the chamber for a gas exchange operation. The pressure within the chamber after the gas exchange operation is not limited, but is generally atmospheric pressure. By this gas exchange operation, water adhering to the starting materials or the interior of the chamber can be removed. Consequently, problems such as attenuation of scintillation light of the eutectic, which is ascribed to such water, can be avoided.

To avoid adverse influence due to water which cannot be removed even by the above gas exchange operation, it is preferred to remove water with the use of a scavenger highly reactive with water. As such a scavenger, a gaseous scavenger such as tetrafluoromethane can be used preferably. When the gaseous scavenger is used, the preferred method is to mix it with the above-mentioned inert gas and introduce the mixture into the chamber.

After the gas exchange operation is performed, the material mixture is heated by the heater until it is melted. The temperature when melting the material mixture differs according to the chemical composition of the material mixture, but is generally in the range of 730° C. to 900° C. which is the eutectic point of lithium fluoride and CaSrF. The method of heating by the heater is not limited, and a high frequency induction heating method or a resistance heating method, for example, can be used as appropriate.

Then, a melt of the molten material mixture is lowered together with the crucible. Since the heater and the heat insulator are arranged so as to be at a high temperature in their upper parts and at a low temperature in their lower parts, the melt solidifies, beginning in its lower portion, as it descends. During such solidification, phase separation between LiF crystals and CaSrF crystals occurs, and a eutectic forms simultaneously with solidification. By further lowering the melt continuously, the melt solidifies unidirectionally from bottom to top, and the eutectic extends along the solidification direction. Thus, a eutectic having a CaSrF crystal phase linearly continuous in one direction can be produced.

In the above-described production method, the rate at which to lower the melt, namely, the solidification rate, is not limited, but is preferably 2 to 50 mm/hr. The faster the solidification rate, the thinner the layer of the LiF crystal phase becomes. By setting the solidification rate at 2 mm/hr or higher, a eutectic with the layer thickness of the LiF crystal phase of 5 µm or less can be produced. If the solidification rate exceeds 50 mm/hr, on the other hand, cloudiness or cracking of the eutectic may be noticeable. Thus, the solidification rate is preferably set at 50 mm/hr or lower.

A temperature change per unit distance along the solidification direction, namely, a temperature gradient, is not limited, but is preferably 0.5° C./mm or more. By setting the temperature gradient at 0.5° C./mm or more, the unidirectionality of the CaSrF crystal phase can be enhanced. The upper limit of the temperature gradient is not limited, but is generally 10° C./mm or less.

The layered structure of the resulting eutectic can be identified by observing a compositional backscattered electron image with the use of a scanning electron microscope (SEM). That is, in the compositional backscattered electron image, the LiF crystal and the CaSrF crystal exhibit a distinct contrast to each other based on the difference between their atomic numbers, so that an image reflecting the layered structure as shown in FIG. 1 can be easily obtained.

The identification of the crystal phases constituting the eutectic can be made by powder X-ray diffraction measurement. That is, by making the powder X-ray diffraction measurement of a powder formed by pulverizing the eutectic and analyzing a diffraction pattern obtained, the eutectic is identified as a eutectic composed of LiF crystals and CaSrF crystals.

The eutectic of the present invention has satisfactory processability, and is easily used as processed into a desired shape. In processing the eutectic, a cutter such as a blade saw or a wire saw, a grinder or an abrasive wheel, which is publicly known, can be used without limitation.

The eutectic of the present invention can be processed into a desired shape to form a neutron scintillator according to the present invention. The shape of the neutron scintillator may be any shape, including the shape of a plate, a block, or an array of a plurality of quadrangular prism-shaped eutectics arranged.

The neutron scintillator comprising the eutectic of the present invention is combined with a photodetector such as a photomultiplier tube, whereby a neutron detector can be constituted. With this neutron detector, scintillation light emitted from the neutron scintillator upon irradiation with neutrons is converted into an electrical signal by the photomultiplier tube, whereby the presence or absence and strength of neutrons can be grasped as the electrical signal. Scintillation light emitted by the neutron scintillator of the present invention is light with a wavelength of about 300 to 700 nm, although the wavelength differs according to the type of the dopant, and the photomultiplier tube capable of detecting light in this region can be used particularly preferably. Specific examples of such a photomultiplier tube are R7600U and H7416 produced by Hamamatsu Photonics K.K.

Concretely, there can be named, for example, a method which comprises coupling the neutron scintillator of the present invention to a photoelectric surface of the photomultiplier tube with the use of an optical grease or the like, applying a high voltage to the photomultiplier tube, and measuring an electrical signal outputted by the photomultiplier tube. In order to analyze the intensity of neutron radiation or the like by utilizing the electrical signal from the photomultiplier tube, an amplifier, a multichannel pulse height analyzer or the like may be provided at a stage subsequent to the photomultiplier tube. Furthermore, the neutron scintillator composed of the eutectic according to the present invention can be combined with a position-sensitive photodetector to construct a neutron imaging device. As the position-sensitive photodetector, a position-sensitive photomultiplier tube can be preferably used. Its examples include XP85012 produced by PHOTONIS USA INC.

EXAMPLES

Hereinbelow, the present invention will be described specifically by reference to its Examples, but the present invention is in no way limited by these Examples. Moreover, not all of combinations of the features described in the Examples are essential to the means for solution to problems that the present invention adopts.

Example 1

Production of Metal Fluoride Eutectic

First, 190 g of strontium fluoride, 150 g of lithium fluoride, and 1.5 g of cerium fluoride were weighed, and thoroughly mixed to prepare a material mixture. The respective materials used were powders with purities of 99.99% or higher, and the $^6$Li-isotope ratio of the lithium fluoride was 95%.

In the material mixture, the mixing ratio between lithium fluoride and strontium fluoride was 0.8 lithium fluoride/0.2 strontium fluoride (mol/mol), and the amount of cerium added was 0.5 mol % with respect to strontium fluoride.

Then, the material mixture was charged into a crucible formed of carbon and having an internal diameter of 50 mm, and the crucible was set in a chamber equipped with a resistance heating type heater, a heat insulator, and a vacuum evacuator. Using the vacuum evacuator, the interior of the chamber was evacuated to $2.0 \times 10^{-4}$ Pa or lower. Then, a gas mixture of 5 vol. % tetrafluoromethane and 95 vol. % of a high purity argon gas was introduced into the chamber for a gas exchange operation. The pressure within the chamber after the gas exchange operation was atmospheric pressure.

After the gas exchange operation was performed, the material mixture was heated by the heater until it was melted.

The heater and the heat insulator were arranged such that a temperature gradient in the solidification direction was 2.5° C./mm, and the output of the heater was adjusted such that the temperature at the bottom of the crucible was 830° C.

Then, a melt of the material mixture melted was continuously lowered together with the crucible to solidify the melt unidirectionally from bottom to top. In the present Example, the rate at which the melt was lowered, namely, the solidification rate, was set at 10 mm/hr. By this procedure, the melt was totally solidified to obtain a metal fluoride eutectic used in the present invention.

Figure 3:
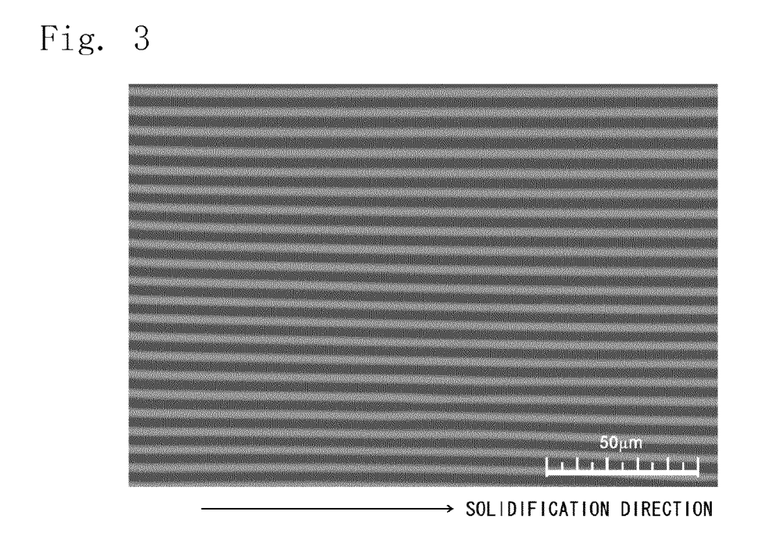
FIG. 3 is a compositional backscattered electron image of a cut surface of a metal fluoride eutectic obtained in Example 1 when the metal fluoride eutectic was cut in a direction parallel to a solidification direction.
Figure 4:
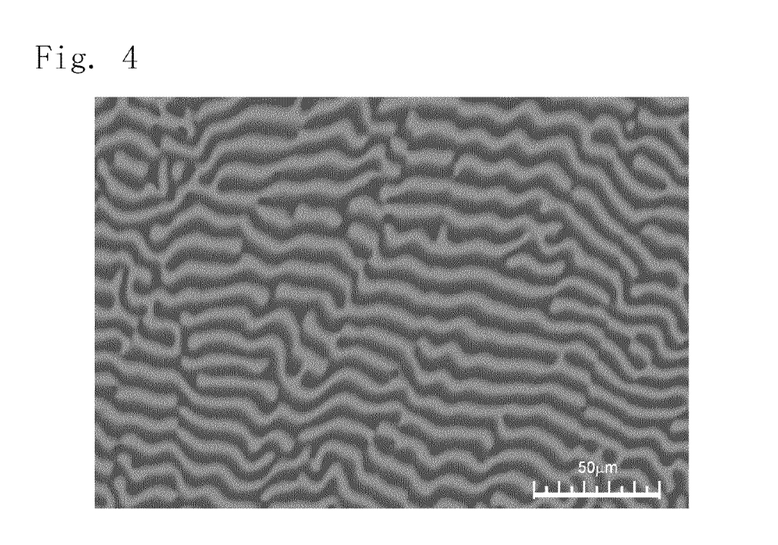
FIG. 4 is a compositional backscattered electron image of a cut surface of the metal fluoride eutectic obtained in Example 1 when the metal fluoride eutectic was cut in a direction perpendicular to the solidification direction.

The resulting metal fluoride eutectic was cut in a direction parallel to the solidification direction and in a direction perpendicular to the solidification direction by a wire saw provided with a diamond wire, and the cut surfaces were mirror polished. A compositional backscattered electron image of the surface when cut in the direction parallel to the solidification direction is shown in FIG. 3. A compositional backscattered electron image of the surface when cut in the direction perpendicular to the solidification direction is shown in FIG. 4. Highlights of the compositional backscattered electron images represent a $SrF_2$ crystal phase containing Ce as a dopant, while shadows of the compositional backscattered electron images represent a LiF crystal phase.

FIG. 3 shows that the $SrF_2$ crystal phase containing Ce as the dopant was linearly continuous in one direction. In connection with the compositional backscattered electron image of FIG. 4, the layer thickness of the LiF crystal phase was measured using the length measuring function of the SEM. The thickness of the layer of LiF in the metal fluoride eutectic was found to be 3 μm. In measuring the layer thickness of the LiF crystal phase, calibration was performed using a standard grid with a spacing length of 25 μm to carry out the measurement.

The resulting eutectic was pulverized to form a powder, which was subjected to powder X-ray diffraction measurement, whereby the crystal phases were identified. "D8 DISCOVER" produced by Bruker AXS K.K. was used as a measuring device. From a diffraction pattern obtained, diffraction peaks attributed to LiF crystals and $SrF_2$ crystals were confirmed, showing that the eutectic was a eutectic composed of LiF crystals and $SrF_2$ crystals.

[Preparation and Characteristics Evaluation of Neutron Scintillator]

The resulting eutectic was cut by a wire saw provided with a diamond wire, and was then ground and mirror polished to be processed into a shape 7 mm in length, 2 mm in width, and 1 mm in thickness. In this manner, a neutron scintillator according to the present invention was obtained. The response characteristics of the neutron scintillator in response to neutrons were evaluated by the following method:

A surface of the neutron scintillator, measuring 7 mm in length and 2 mm in width, was coupled to a photoelectric surface of a photomultiplier tube (R7600U produced by Hamamatsu Photonics K.K.) with the use of an optical grease to produce a neutron detector.

The neutron detector was covered with a light shielding material made of a black vinyl sheet so that external light would not enter the photoelectric surface of the photomultiplier tube. Then, the neutron scintillator was irradiated with neutrons from $^{252}Cf$ with radioactivity of 1 MBq, the neutrons being slowed down via a neutron moderator comprising a polyethylene block having a thickness of 40 mm. To measure scintillation light emitted from the neutron scintillator, a high voltage of 800V was applied from a power supply line to the photomultiplier tube, whereby scintillation light was converted into an electrical signal, which was outputted from a signal output line. The electrical signal outputted from the photomultiplier tube is a pulsed signal reflecting the scintillation light, and the pulse height of the pulsed signal represents the brightness of scintillation light. Such electrical signals outputted from the photomultiplier tube were shaped and amplified by a shaping amplifier, and then entered into a multichannel pulse height analyzer to analyze them and prepare a pulse height spectrum.

Figure 5:
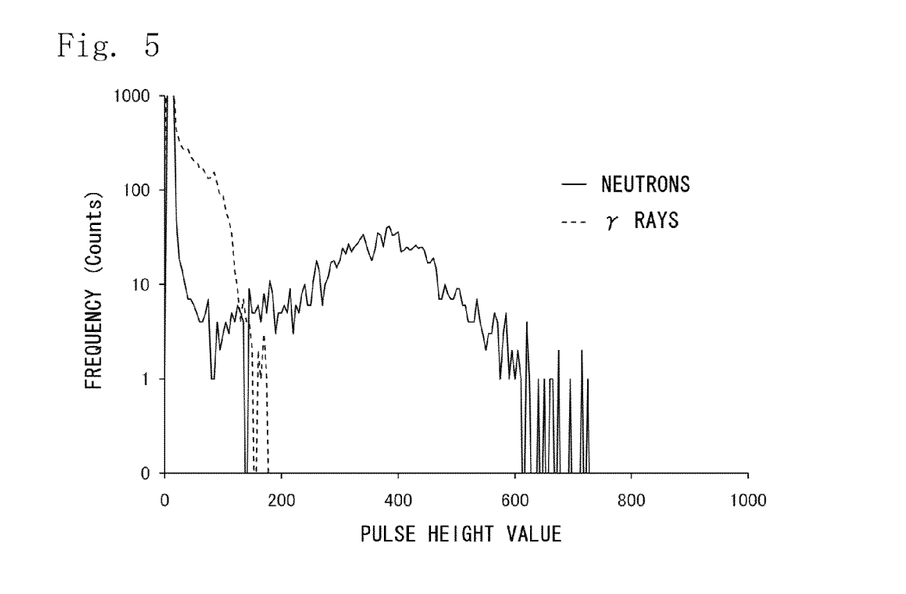
FIG. 5 shows the pulse height spectra of a neutron scintillator of Example 1 when irradiated with neutrons and γ rays.

The resulting pulse height spectrum is shown in FIG. 5. The abscissa of the pulse height spectrum represents the pulse height value of the electrical signal, namely, the brightness of the scintillation light, indicating here the value of the pulse height channel of the multichannel pulse height analyzer. The ordinate represents the frequency of the electrical signal showing each pulse height value. The frequency was expressed as the number of times (counts) the electrical signal concerned was measured.

From FIG. 5, clear peaks indicating the detection of neutrons were confirmed at a position with the pulse height value of about 380. This finding has proved that the eutectic of the present invention acts effectively as a neutron scintillator, and that the neutron detector using the neutron scintillator is effective.

To evaluate the n/γ discrimination ability of the neutron scintillator, the neutron scintillator was irradiated with γ rays generated by $^{137}Cs$ having radioactivity of 1 kBq, instead of neutrons from the $^{252}Cf$. A pulse height spectrum was prepared in the same manner as described above.

The resulting pulse height spectrum is shown by a dashed line in FIG. 5. In the pulse height spectrum, the pulse height value obtained when the neutron scintillator was excited with γ rays was about 180 at the maximum, a value sufficiently low as compared with the peaks of the pulse height values in the case of neutron irradiation. It is seen, therefore, that γ-ray noises can be easily eliminated, for example, by taking the pulse height value of 180 as a threshold value, removing electrical signals of pulse height values below this threshold value, and selecting only electrical signals of pulse height values exceeding the threshold value. That is, the neutron scintillator of the present invention has been found to have excellent n/γ discrimination ability.

[Manufacture and Characteristics Evaluation of Neutron Imaging Device]

A neutron imaging device was manufactured in the following manner by using the metal fluoride eutectic as a neutron scintillator and combining it with a position-sensitive photomultiplier tube:

The metal fluoride eutectic produced above was cut by a wire saw provided with a diamond wire, and was then ground and mirror polished to be processed into a shape about 50 mm in diameter and 0.5 mm in thickness. In this manner, a disk-shaped scintillator plate was manufactured.

The scintillator plate was coupled to an optical detection surface of a position-sensitive photomultiplier tube (XP85012, produced by PHOTONIS USA INC.) with the use of an optical grease to manufacture a neutron imaging device. The position-sensitive photomultiplier tube is a 64-channel multi-anode photomultiplier tube having anodes arranged longitudinally and laterally in a 8×8 channel array.

A head amplifier unit (Model 80190 head amplifier unit for multi-anode photomultiplier tube, produced by CLEAR-PULSE CO., LTD.) was connected to the position-sensitive photomultiplier tube, and then they were covered with a light shielding material made of a black vinyl sheet so that external light would not enter. A signal line was connected between the head amplifier unit and an interface device (Model 80190 PCIF, produced by CLEAR-PULSE CO., LTD.), and the interface device and a personal computer were connected together. Using a control program created by CLEAR-PULSE CO., LTD., these devices were operated such that the pulse height values for the 64 channels could each be acquired at predetermined time intervals.

The neutron imaging device configured to be capable of reading out signals in the above manner was used to obtain a neutron radiographic image. $^{252}$Cf with radioactivity of 1 MBq was set at a position opposing the scintillator plate. A neutron moderator comprising a polyethylene block having a thickness of 40 mm was set between the scintillator plate and the $^{252}$Cf to slow down neutrons from the $^{252}$Cf, and the scintillator plate was irradiated with the slow neutrons.

A cadmium plate with a high shielding ability for neutrons was used for imaging object. A cadmium plate provided with circular holes of 1, 2, 3 and 5 mm in diameter, having a plate surface measuring 35 mm×35 mm, and having a thickness of 0.5 mm was prepared. This cadmium plate was set in proximity to the scintillator plate, and signal acquisition was started to obtain a neutron radiographic image.

First, a voltage of 2200V was applied to operate the position-sensitive photomultiplier tube and the head amplifier unit and acquire the pulse height values in the 64 channels at intervals of 5 microseconds. When signals of the pulse height values exceeding a value set as a threshold value were outputted from any of the 64 channels, these pulse height values were recorded as event data. The threshold value was set in order to eliminate signals due to background noise from the device caused even when the neutron scintillator did not emit light.

To select only signals attributed to neutrons from the event data obtained, the total of the pulse height values in the 64 channels included in the event data was calculated, and a pulse height spectrum using the total value was prepared. The resulting pulse height spectrum was similar to that indicated by the solid line in FIG. 5, and clear peaks showing the detection of neutrons were confirmed therefrom.

Using the event data corresponding to peaks on the pulse height spectrum, the centroid of charges for each event data was calculated to pinpoint the position of incidence of neutrons.

The centroid of charges refers to coordinates corresponding to the location of the centroid of electrons generated on the photoelectric surface of the position-sensitive photomultiplier tube. The coordinates are obtained from the following equations:

$$X_D = \Sigma(X_i \times I_i)/\Sigma(I_i)$$

$$Y_D = \Sigma(Y_i \times I_i)/\Sigma(I_i)$$

where $X_D$ and $Y_D$ represent, respectively, the X coordinate and the Y coordinate of the centroid of charges, $X_i$ and $Y_i$ represent, respectively, the X coordinate and the Y coordinate of the ith channel, and $I_i$ represents the pulse height value of the ith channel.

By calculating the centroid of charges mentioned above, it becomes possible to pinpoint the position of incidence of neutrons with much higher position resolution than the pitch of the anodes of the multi-anode system.

Using the position of incidence of neutrons for each event data obtained by the calculation of the centroid of charges, a neutron radiographic image of 100×100 pixels was prepared. Since the optical detection surface of the position-sensitive photomultiplier tube used in the present Example measured 50 mm×50 mm, each pixel measured 0.5 mm×0.5 mm. The neutron radiographic image was shown on a 128-tone gray scale in which white represented the position where neutrons were incident in a large amount, while black represented the position where neutrons were incident in a small amount.

Figure 7:
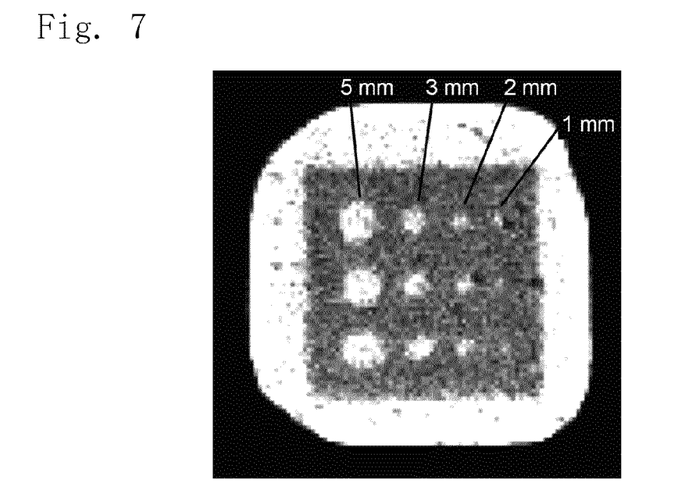
FIG. 7 shows a neutron radiographic image by a neutron imaging device obtained in Example 1.

The resulting neutron radiographic image is shown in FIG. 7. FIG. 7 reveals that neutrons were incident greatly in the hole sections provided in the cadmium plate, whereas neutrons were incident minimally in the sections shielded by the cadmium plate. These findings demonstrate that the neutron imaging device using the neutron scintillator of the present invention is effective.

From this neutron radiographic image, the shapes and sizes of the holes provided in the cadmium plate can be confirmed, proving that the neutron imaging device has high position resolution.

Example 2

Production of Metal Fluoride Eutectic

First, 100 g of strontium fluoride, 63 g of calcium fluoride, 160 g of lithium fluoride, and 1.6 g of cerium fluoride were weighed, and thoroughly mixed to prepare a material mixture. The respective materials used were powders with purities of 99.99% or higher, and the $^6$Li-isotope ratio of the lithium fluoride was 95%.

In the material mixture, the mixing ratio among lithium fluoride, strontium fluoride and calcium fluoride was 0.8 lithium fluoride/0.1 strontium fluoride/0.1 calcium fluoride (mol/mol/mol), and the amount of cerium added was 0.5 mol % with respect to the total amount of strontium fluoride and calcium fluoride.

Then, the material mixture was charged into a crucible formed of carbon and having an internal diameter of 50 mm, and the crucible was set in a chamber equipped with a resistance heating type heater, a heat insulator, and a vacuum evacuator. Using the vacuum evacuator, the interior of the chamber was evacuated to 2.0×10$^{-4}$ Pa or lower. Then, a gas mixture of 5 vol. % tetrafluoromethane and 95 vol. % of a high purity argon gas was introduced into the chamber for a gas exchange operation. The pressure within the chamber after the gas exchange operation was atmospheric pressure.

After the gas exchange operation was performed, the material mixture was heated by the heater until it was melted.

The heater and the heat insulator were arranged such that a temperature gradient in the solidification direction was 2.5° C./mm, and the output of the heater was adjusted such that the temperature at the bottom of the crucible was 830° C.

Then, a melt of the material mixture melted was continuously lowered together with the crucible to solidify the melt unidirectionally from bottom to top. In the present Example, the rate at which the melt was lowered, namely, the solidification rate, was set at 10 mm/hr. By this procedure, all of the melt was solidified to obtain a metal fluoride eutectic used in the present invention.

The resulting metal fluoride eutectic was cut in a direction parallel to the solidification direction and in a direction perpendicular to the solidification direction by a wire saw provided with a diamond wire, and the cut surfaces were mirror polished. Observations of a compositional backscattered electron image of the surface cut in the direction parallel to the solidification direction and a compositional backscattered electron image of the surface cut in the direction perpendicular to the solidification direction showed these images to be similar to those in FIGS. 3 and 4, respectively. Highlights of the compositional backscattered electron images represent a CaSrF crystal phase containing Ce as a dopant, while shadows of the compositional backscattered electron images represent a LiF crystal phase. Upon chemical composition analysis of the highlights of the compositional backscattered electron images using an energy dispersive X-ray spectrometer (EDS), the chemical composition of the CaSrF crystal phase was found to be $Ca_{0.5}Sr_{0.5}F_2$.

As in Example 1, it was found that the CaSrF crystal phase containing Ce as a dopant was linearly continuous in one direction, and the thickness of the layer of LiF was 3 μm.

The resulting metal fluoride eutectic was subjected to powder X-ray diffraction measurement in the same manner as in Example 1. Diffraction peaks attributed to LiF crystals and CaSrF crystals were confirmed, showing that the eutectic was a eutectic composed of LiF crystals and CaSrF crystals.

[Preparation and Characteristics Evaluation of Neutron Scintillator]

The resulting eutectic was processed into a shape 7 mm in length, 2 mm in width, and 1 mm in thickness, in the same manner as in Example 1, to obtain a neutron scintillator according to the present invention. The response characteristics of the neutron scintillator in response to neutrons were evaluated in the same manner as in Example 1.

Figure 6:
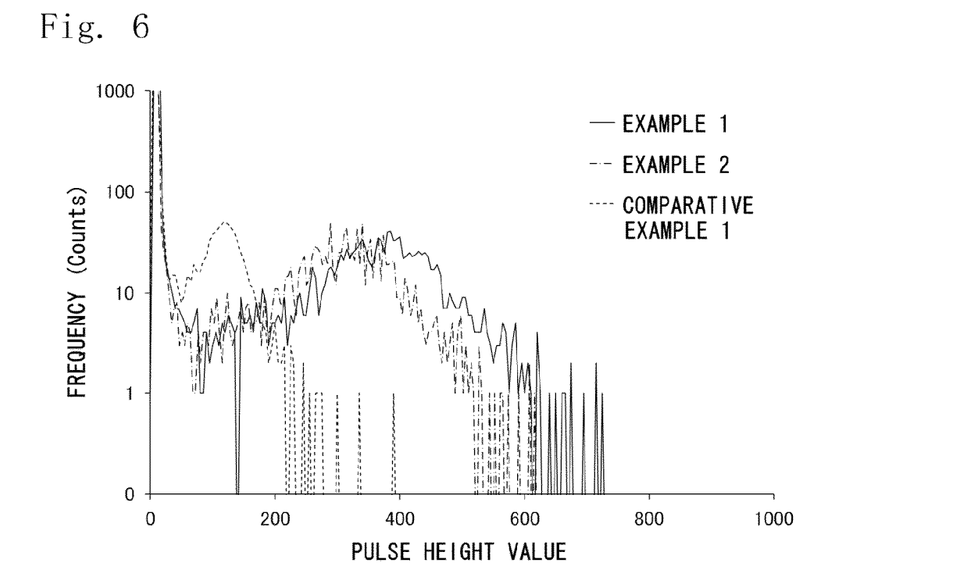
FIG. 6 shows the pulse height spectra of scintillators obtained in Example 1, Example 2 and Comparative Example 1 when the scintillators were irradiated with neutrons.

A pulse height spectrum obtained by irradiation with neutrons from $^{252}$Cf is indicated by a chain line in FIG. 6. From FIG. 6, clear peaks indicating the detection of neutrons were confirmed at a position with the pulse height value of about 320. This finding has proved that the eutectic of the present invention acts effectively as a neutron scintillator, and that a neutron detector using the neutron scintillator is effective.

Comparative Example 1

Production of Eutectic Composed of LiF and $CaF_2$

In the present comparative example, a metal fluoride eutectic composed of lithium fluoride crystals and cerium-containing calcium fluoride crystals was produced.

First, 150 g of calcium fluoride, 190 g of lithium fluoride, and 1.9 g of cerium fluoride were weighed, and thoroughly mixed to prepare a material mixture. The respective materials used were powders with purities of 99.99% or higher, and the $^6$Li-isotope ratio of the lithium fluoride was 95%.

In the material mixture, the mixing ratio between lithium fluoride and calcium fluoride was 0.8 lithium fluoride/0.2 calcium fluoride (mol/mol), and the amount of cerium added was 0.5 mol % with respect to calcium fluoride.

Then, the material mixture was charged into a crucible formed of carbon and having an internal diameter of 50 mm, and the crucible was set in a chamber equipped with a resistance heating type heater, a heat insulator, and a vacuum evacuator. Using the vacuum evacuator, the interior of the chamber was evacuated to $2.0 \times 10^{-4}$ Pa or lower. Then, a high purity argon gas mixed with 5 vol. % tetrafluoromethane was introduced into the chamber for a gas exchange operation. The pressure within the chamber after the gas exchange operation was atmospheric pressure.

After the gas exchange operation was performed, the material mixture was heated by the heater until it was melted. The heater and the heat insulator were arranged such that a temperature gradient in the solidification direction was 2.5° C./mm, and the output of the heater was adjusted such that the temperature at the bottom of the crucible was 830° C.

Then, a melt of the material mixture melted was continuously lowered together with the crucible to solidify the melt unidirectionally from bottom to top. In the present Comparative Example, the rate at which the melt was lowered, namely, the solidification rate, was set at 10 mm/hr. By this procedure, all of the melt was solidified to obtain a metal fluoride eutectic.

The resulting metal fluoride eutectic was processed in the same manner as in Example 1, and its compositional backscattered electron image was observed. In the eutectic of the present Comparative Example, it was found that a $CaF_2$ crystal phase was linearly continuous in one direction, and the thickness of the layer of LIE was 3 μm.

A powder of the resulting metal fluoride eutectic pulverized was subjected to powder X-ray diffraction measurement in the same manner as in Example 1, whereby the crystal phases were identified. From a diffraction pattern obtained, diffraction peaks attributed to LiF crystals and $CaF_2$ crystals were confirmed, showing that the metal fluoride eutectic was a metal fluoride eutectic composed of LiF crystals and $CaF_2$ crystals.

[Preparation and Characteristics Evaluation of Neutron Scintillator]

The resulting metal fluoride eutectic was processed in the same manner as in Example 1 to obtain a neutron scintillator. The response characteristics of the neutron scintillator in response to neutrons were evaluated in the same manner as in Example 1. A pulse height spectrum obtained upon irradiation with neutrons from $^{252}$Cf is indicated by a dashed line in FIG. 6.

From FIG. 6, clear peaks indicating the detection of neutrons were confirmed in any of Example 1, Example 2 and Comparative Example 1. This finding proves that the scintillators of Example 1, Example 2 and Comparative Example 1 act as neutron scintillators. In the pulse height spectra, the pulse height values at the peak positions, which the scintillators of Example 1, Example 2 and Comparative Example 1 exhibited, were 380, 320 and 120, respectively. Thus, the scintillators composed of the metal fluoride eutectics of the present invention are found to have very large light yield. In the pulse height spectra, slopes observed in the region at pulse height values of about 50 or less are ascribed to pulse signals due to electrical noises. Pulse signals based on luminescence produced upon detection of neutrons by the scintillator of the present invention have much higher pulse height values than those of the pulse signals due to electrical noises. Thus, the scintillator of the present invention is found to be satisfactory in the S/N ratio.

The invention claimed is:

1. A metal fluoride eutectic comprising a lithium fluoride crystal phase and a $Ca_{1-x}Sr_xF_2$ (where x denotes a number greater than 0, but not larger than 1) crystal phase.

2. The metal fluoride eutectic according to claim 1, wherein the $Ca_{1-x}Sr_xF_2$ (where x denotes a number greater than 0, but not larger than 1) crystal phase contains at least one dopant selected from the group consisting of manganese, europium and cerium.

3. The metal fluoride eutectic according to claim 1, wherein both crystal phases form a layered structure, and a layer thickness of the lithium fluoride crystal phase is 0.1 μm to 5 μm.

4. The metal fluoride eutectic according to claim 1, wherein the $Ca_{1-x}Sr_xF_2$ crystal phase is linearly continuous in one direction.

5. A neutron scintillator comprising the metal fluoride eutectic according to claim 1.

6. A neutron imaging device comprising a combination of the neutron scintillator according to claim 5 and a position-sensitive photomultiplier tube.

* * * * *